US011514963B2

(12) United States Patent
Drouard et al.

(10) Patent No.: US 11,514,963 B2
(45) Date of Patent: Nov. 29, 2022

(54) SOT MRAM CELL AND ARRAY COMPRISING A PLURALITY OF SOT MRAM CELLS

(71) Applicant: ANTAIOS, Meylan (FR)

(72) Inventors: Marc Drouard, Valence (FR); Julien Louche, Saint-Martin-le-Vinoux (FR)

(73) Assignee: Antaios, Meylan (FR)

( * ) Notice: Subject to any disclaimer, the term of this patent is extended or adjusted under 35 U.S.C. 154(b) by 0 days.

(21) Appl. No.: 17/125,610

(22) Filed: Dec. 17, 2020

(65) Prior Publication Data
US 2021/0210127 A1 Jul. 8, 2021

(30) Foreign Application Priority Data

Jan. 7, 2020 (EP) .................................... 20315002

(51) Int. Cl.
| | | |
|---|---|---|
| *G11C 11/16* | (2006.01) | |
| *H01L 27/22* | (2006.01) | |
| *H01L 43/02* | (2006.01) | |
| *H01L 43/08* | (2006.01) | |

(52) U.S. Cl.
CPC ........ *G11C 11/161* (2013.01); *G11C 11/1655* (2013.01); *G11C 11/1657* (2013.01); *G11C 11/1673* (2013.01); *G11C 11/1675* (2013.01); *H01L 27/226* (2013.01); *H01L 43/02* (2013.01); *H01L 43/08* (2013.01)

(58) Field of Classification Search
CPC .............. G11C 11/161; G11C 11/1655; G11C 11/1657; G11C 11/1673; G11C 11/1675; G11C 8/16; G11C 11/1659; G11C 11/18; H01L 27/226; H01L 43/02; H01L 43/08; H01L 27/222

USPC .................................................. 365/158, 173
See application file for complete search history.

(56) References Cited

U.S. PATENT DOCUMENTS

| | | | | |
|---|---|---|---|---|
| 10,483,457 | B1* | 11/2019 | Lee ......................... | H01L 43/02 |
| 10,762,942 | B1* | 9/2020 | Katti .................... | G11C 11/1659 |
| 10,802,827 | B2* | 10/2020 | Jaiswal ................. | H03K 19/18 |
| 10,991,406 | B2* | 4/2021 | Jaiswal ............... | G11C 11/1675 |
| 2018/0061467 | A1* | 3/2018 | Kan ..................... | G11C 11/1675 |
| 2019/0006415 | A1* | 1/2019 | Li ........................ | G11C 11/1675 |
| 2019/0051815 | A1* | 2/2019 | Kakinuma .......... | H01F 10/3254 |
| 2020/0005844 | A1* | 1/2020 | Alhalabi ............. | G11C 11/1675 |
| 2020/0006627 | A1* | 1/2020 | Manipatruni ....... | G11C 11/1659 |

(Continued)

OTHER PUBLICATIONS

EP Search Report for EP Application No. EP 20315002, dated Jun. 8, 2020, 8 pgs.

(Continued)

*Primary Examiner* — Michael T Tran
(74) *Attorney, Agent, or Firm* — Blank Rome LLP

(57) ABSTRACT

A SOT-MRAM cell, comprising at least one magnetic tunnel junction (MTJ) comprising a tunnel barrier layer between a pinned ferromagnetic layer and a free ferromagnetic layer; a SOT line, extending substantially parallel to the plane of the layers and contacting a first end of said at least one MTJ; at least a first source line connected to one end of the SOT line; at least a first bit line and a second bit line, wherein the SOT-MRAM cell comprises one MTJ, each bit line being connected to the other end of the MTJ; or wherein the SOT-MRAM cell comprises two MTJs, each MTJ being connected to one of the first bit line and second bit line.

8 Claims, 10 Drawing Sheets

(56) References Cited

U.S. PATENT DOCUMENTS

| | | | |
|---|---|---|---|
| 2020/0066968 A1* | 2/2020 | Park | H01L 43/12 |
| 2020/0075099 A1* | 3/2020 | Choi | G11C 19/08 |
| 2020/0075670 A1* | 3/2020 | Lin | G11C 11/18 |
| 2020/0082858 A1* | 3/2020 | Kim | G11C 11/161 |
| 2020/0135804 A1* | 4/2020 | Luo | G11C 11/1675 |
| 2020/0136016 A1* | 4/2020 | Lin | G11C 11/18 |
| 2020/0343300 A1* | 10/2020 | Aggarwal | H01L 43/10 |

OTHER PUBLICATIONS

Y. Seo, et al., "High Performance and Energy-Efficient On-Chip Cache Using Dual Port (1R/1W) Spin-Orbit Torque MRAM", IEEE Journal on Emerging and Selected Topics in Circuits and Systems, vol. 6, No. 3, Sep. 2016, pp. 293-304.

Y. Kim, et al., "DSH-MRAM: Differential Spin Hall MRAM for On-Chip Memories", IEEE Electron Device Letters, vol. 34, No. 10, Oct. 2013, pp. 1259-1261.

R. Bishnoi, et al., "Low-Power Multi-Port Memory Architecture Based on Spin Orbit Torque Magnetic Devices", Great Lakes Symposium on VLSI, ACM, May 18, 2016, pp. 409-414.

* cited by examiner

US 11,514,963 B2

SOT MRAM CELL AND ARRAY COMPRISING A PLURALITY OF SOT MRAM CELLS

RELATED APPLICATION

This application claims the benefit of European Application No. EP20315002, filed on Jan. 7, 2020. The entire content of this application is hereby incorporated by reference.

FIELD

The present invention concerns spin-orbit torque (SOT)-magnetic random access memory (MRAM) cells and array comprising a plurality of the SOT-MRAM cells.

DESCRIPTION OF RELATED ART

Spin-orbit torque (SOT)-magnetic random access memory (MRAM) elements has been identified as a promising candidate. A conventional SOT-MRAM element 10 is shown in FIG. 1. The SOT-MRAM element 10 comprises a magnetic tunnel junction (MTJ) 20 including a tunnel barrier layer 22 sandwiched between a pinned ferromagnetic layer 21 having a pinned magnetization 210, and a free ferromagnetic layer 23 having a free magnetization 230. The SOT-MRAM element 10 further comprises a heavy metal SOT line 30 extending substantially parallel to the plane of the layers 21-23 and contacting the MTJ 20 on its first end (on the side of the free layer 23). The SOT line 30 is configured for passing a SOT current 31 adapted for switching the second magnetization 230. In particular, the SOT current 31 exerts a torque on the initial orientation of the free magnetization 230, through spin Hall effect and/or Rashba-Edelstine effect, so that the orientation of the free magnetization 230 change, for example, from being parallel to antiparallel to the pinned magnetization 210.

The SOT based switching allows for using lower current density as well as separate read- and write-paths. The pinned and free magnetizations 210 and 230 can be perpendicular to the plane of the layers 21, 23 (as shown in FIG. 1) or parallel to the plane of the layers 21, 23.

FIGS. 2a and 2b show a conventional SOT-MRAM cell 100 comprising the SOT-MRAM element 10, a bit line BL connected to one end of the SOT line 30 and a source line SL connected to the Mill 20, via a first transistor 40. The first transistor 40 is connected to a second end of the MTJ 20 opposed to the first end (on the side of the pinned layer 21). The source line SL is further connected to the other end of the SOT line 30 via a second transistor 41. The gate of the first transistor 40 is controlled by a read word line WLR and the gate of the second transistor 41 is controlled by a write word line WLW. The SOT-MRAM cell 100 forms a three-terminal, two transistor and one resistor (2T1R) single level cell (SLC) circuit.

During a write operation (FIG. 2a), an appropriate write voltage $V_{write}$, positive or negative, is applied to the bit line BL and the source line SL is set to "0". The write word line WLW is biased to "1" in order to control the second transistor 41 in a passing mode, such that a SOT current 31 can be passed in the SOT line 30. The first transistor 40 is in the closed mode "0" and no current flows in the MTJ 20.

Alternatively, instead of applying a negative voltage on BL, a positive write voltage $V_{write}$ can be applied to the SL and BL is set at "0".

During a read operation (FIG. 2b), an appropriate read voltage $V_{read}$ is applied to the bit line BL and the source line SL is set to "0". The read word line WLR is biased to "1" in order to control the first transistor 40 in a passing mode to pass a read current 32 in the MTJ 20. The second transistor 41 is in the closed mode and no current flows in the SOT line 30.

The 2T1R SOT-MRAM cell 100 shown in FIGS. 2a and 2b may be used in a single port circuit whereby the same bit line BL is used for inputting the SOT current 31 and the read current 32, by applying a write voltage $V_{write}$ and read voltage $V_{read}$ respectively. During the read operation, a leakage current $I_{leak}$ may flow through the second transistor 41 connected to the SOT line 30, as the read current 32 may prefer to flow through the low resistance path transistor 40 rather than high resistance path transistor 41.

FIG. 3a shows a variant of the 2T1R SOT-MRAM cell 100 shown in FIGS. 2a, 2b, described in reference: Yeong-kyo Seo, et al., "High Performance and Energy-Efficient On-Chip Cache Using Dual Port (1R/1W) Spin-Orbit Torque MRAM", IEEE Journal on Emerging and Selected Topics in Circuits and Systems, Vol. 6, Issue 3, September 2016. Here, the SOT-MRAM cell 100 comprises a source line SL connected one end of the SOT line 30, a read bit line BLR connected to the second end of the MTJ 20 via a first transistor 40, and a write bit line BLW connected to the other end of the SOT line 30 via a second transistor 41. The gate of the first transistor 40 is controlled by a read word line WLR and the gate of the second transistor 41 is controlled by a write word line WLW.

FIG. 3b represents an array 200 comprising two of the SOT-MRAM cells 100 of FIG. 3a. The read bit line BLR and the write bit line BLW are connected to a MTJ 20 in a column. Reading the array 200 can be performed by applying a read voltage $V_{read}$ to the read bit line BLR and setting the source line SL to "0". A read current 32 is passed in the MTJ 20 when the first transistor 40 is in the passing mode. The first transistor 40 of the top MTJ 20 is in the passing mode such that the top MTJ 20 is read. Writing the array can be performed by applying a write voltage $V_{write}$ to the write bit line BLW and setting the source line SL to "0". A SOT current 31 is passed in the SOT line 30 when the second transistor 41 is in the passing mode (bottom MTJ 20 in FIG. 3b). One MTJ 20 can be read, by applying the read voltage $V_{read}$ between the read bit line BLR and the source line SL and setting the first transistor 40 in the passing mode, while another MTJ 20 is written simultaneously by applying the write voltage $V_{write}$ on the write bit line BLW, setting the source line SL to "0" and setting the second transistor 42 in the passing mode. As the MTJs 20 in a column share the same read bit line BLR, it is not possible to perform a simultaneous read operation on the same column. Equally, it is not possible to perform a write operation on the same column.

At memory level, reading and writing can be either performed on one Read/Write port by using respectively and sequentially the read bit line BLR and the write bit line BLW, or on one port read and one port write simultaneously as in a two port register file. Simultaneous reading and writing the MTJs 20 on the same SOT-MRAM cell 100 is not possible. Moreover, during the write operation the source line SL is set at 0V such that the write bit line BLW needs to be set at a negative voltage depending on the polarity of the SOT current 31.

SUMMARY

The present disclosure concerns a SOT-MRAM cell, comprising: at least one magnetic tunnel junction (MTJ)

comprising a tunnel barrier layer between a pinned ferromagnetic layer and a free ferromagnetic layer; a SOT line, extending substantially parallel to the plane of the layers and contacting a first end of said at least one MTJ; at least a first source line connected to one end of the SOT line; and at least a first bit line and a second bit line, wherein the SOT-MRAM cell comprises one MTJ, each bit line being connected to the other end of the MTJ; or wherein the SOT-MRAM cell comprises two MTJs, each MTJ being connected to one of the first bit line and second bit line.

The present disclosure further concerns an array comprising a plurality of the SOT MRAM cells.

The SOT MRAM cell disclosed herein provides either a dual port functionality (simultaneous read, simultaneous write or simultaneous read and write) or a differential read/write in a single port architecture.

BRIEF DESCRIPTION OF THE DRAWINGS

The invention will be better understood with the aid of the description of an embodiment given by way of example and illustrated by the figures, in which:

FIG. 3b represents an array comprising two of the SOT-MRAM cell of FIG. 3a,

FIG. 6 shows a variant of the SOT-MRAM cell of FIG. 5a;

FIG. 7 shows another variant of the SOT-MRAM cell of FIG. 5a;

DETAILED DESCRIPTION OF POSSIBLE EMBODIMENTS

Figure 1:
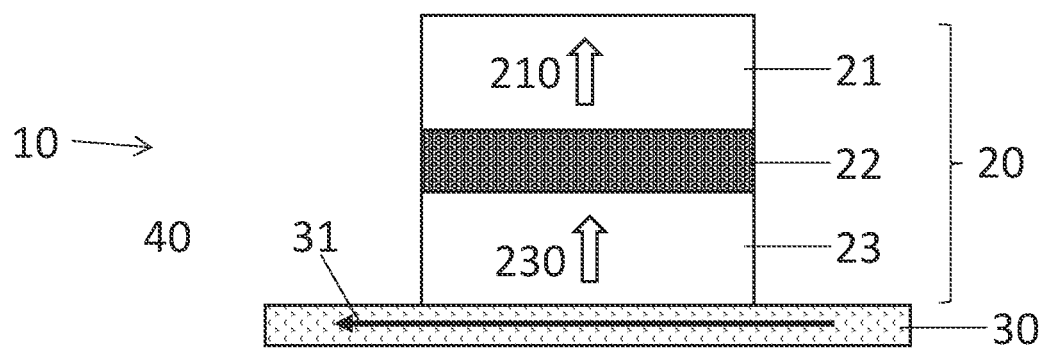
FIG. 1 shows a conventional SOT-MRAM element.
Figures 2A, 2B:
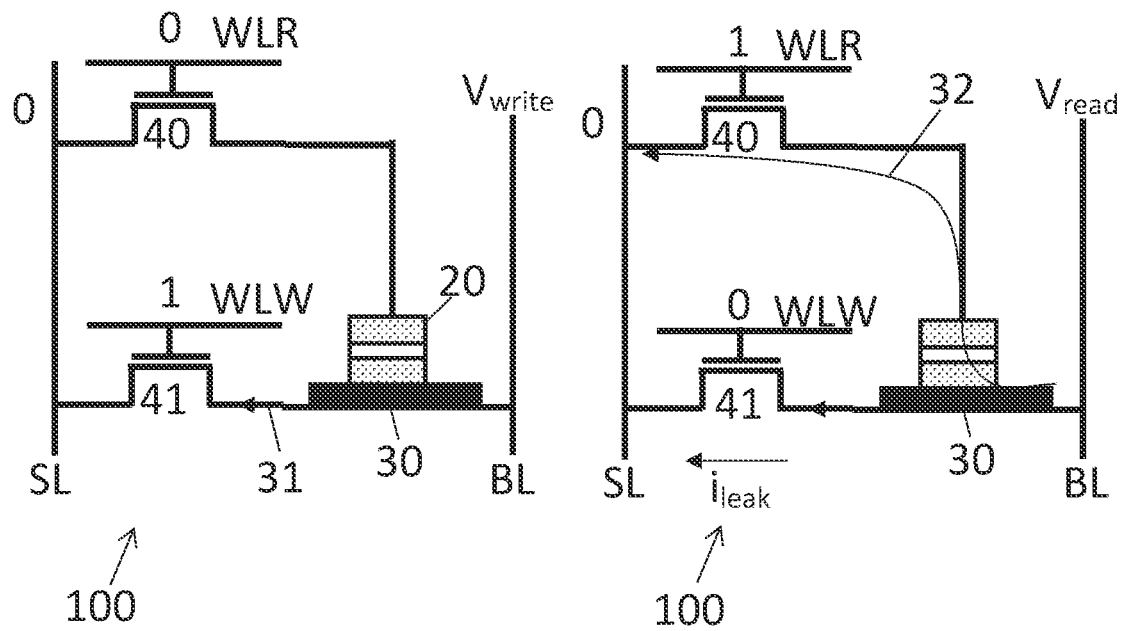
FIGS. 2a and 2b show a conventional SOT-MRAM cell including the SOT-MRAM element of FIG. 1, during a write operation (FIG. 2a) and a read operation (FIG. 2b)
Figure 3A:
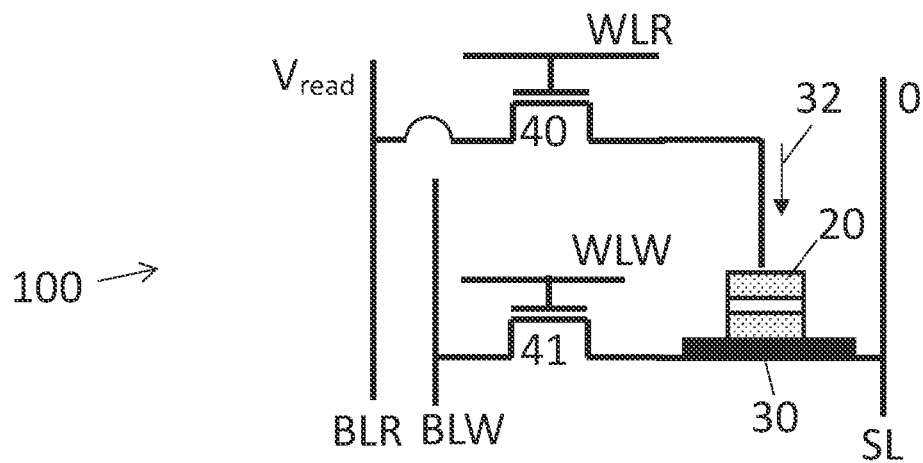
FIG. 3a shows a variant of the SOT-MRAM cell of FIGS. 2a, b.
Figure 3B:
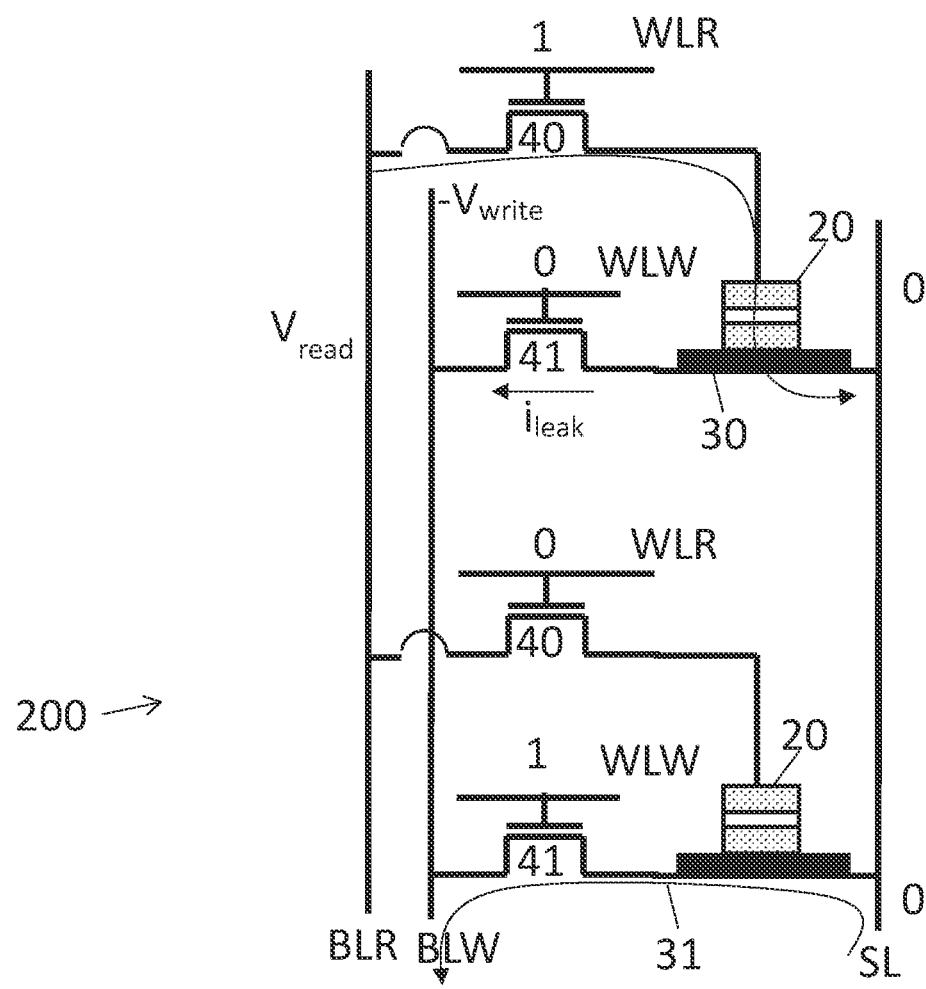
Figure 4A:
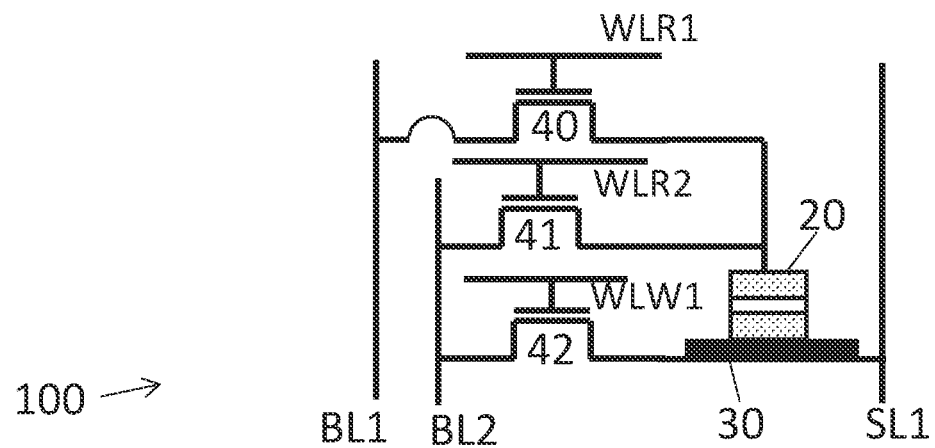
FIG. 4a shows a SOT-MRAM cell, according to an embodiment.

FIG. 4a shows a SOT-MRAM cell 100, according to an embodiment. The SOT-MRAM cell 100 comprises one SOT-MRAM element 10, a first source line SL1 connected to one end of the SOT line 30 and a first bit line BL1 connected to the second end of the MTJ 20 via a first transistor 40. The SOT-MRAM cell 100 further comprises a second bit line BL2 connected to the other end of the SOT line 30 via a third transistor 42 and connected to the second end of the MTJ 20 via a second transistor 41. A first read word line WLR1 and a second read word line WLR2 connect the gate of the first transistor 40 and the second transistor 41, respectively. A first write word line WLW1 connects the gate of the third transistor 42. The SOT-MRAM cell 100 of FIG. 4a forms a 3T1R circuit.

Figure 4B:
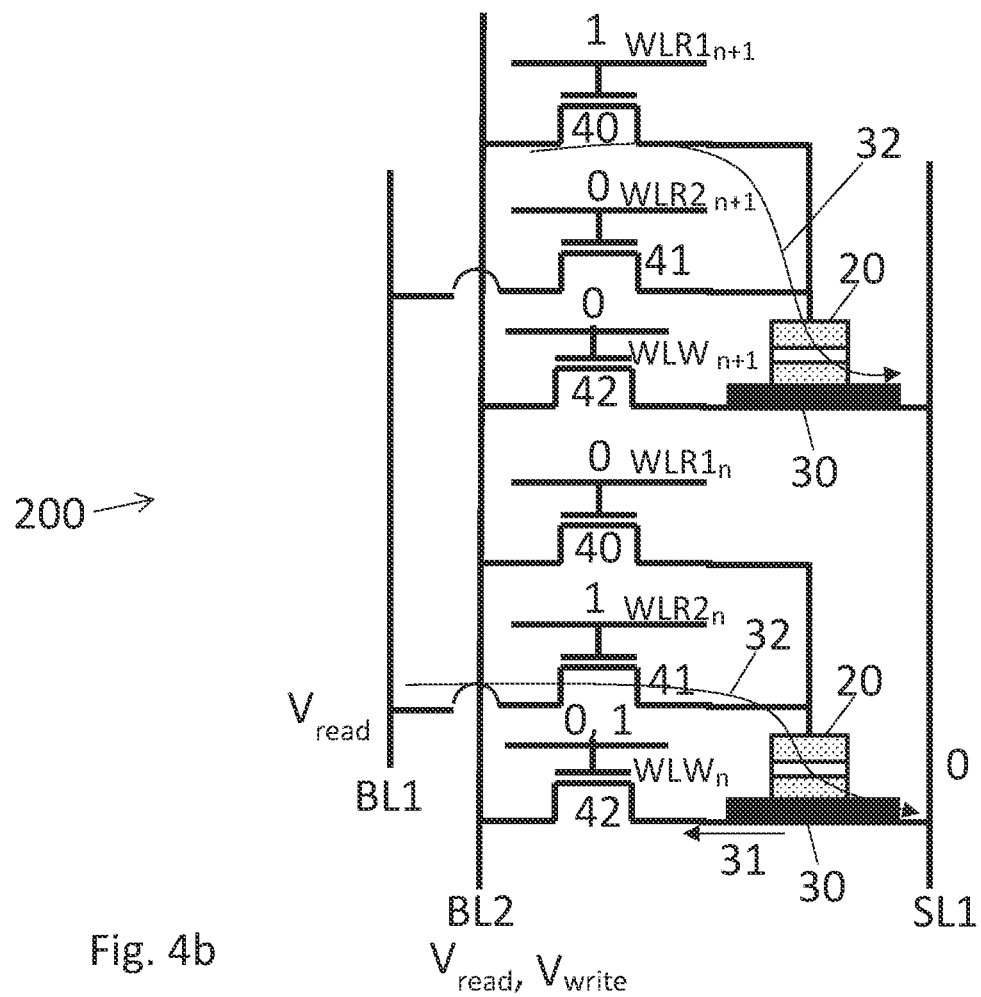
FIG. 4b represents an array comprising two of the SOT-MRAM cell of FIG. 4a arranged columnwise, according to an embodiment.

FIG. 4b illustrates an array 200 comprising two of the SOT-MRAM cell 100 of FIG. 4a arranged columnwise, according to an embodiment. Each of the first and second bit line BL1, BL2 and the first source line SL1 is connected to a SOT-MRAM element 10 in a column. It is understood that the array 200 can comprise more that two SOT-MRAM cells 100.

Figure 4C:
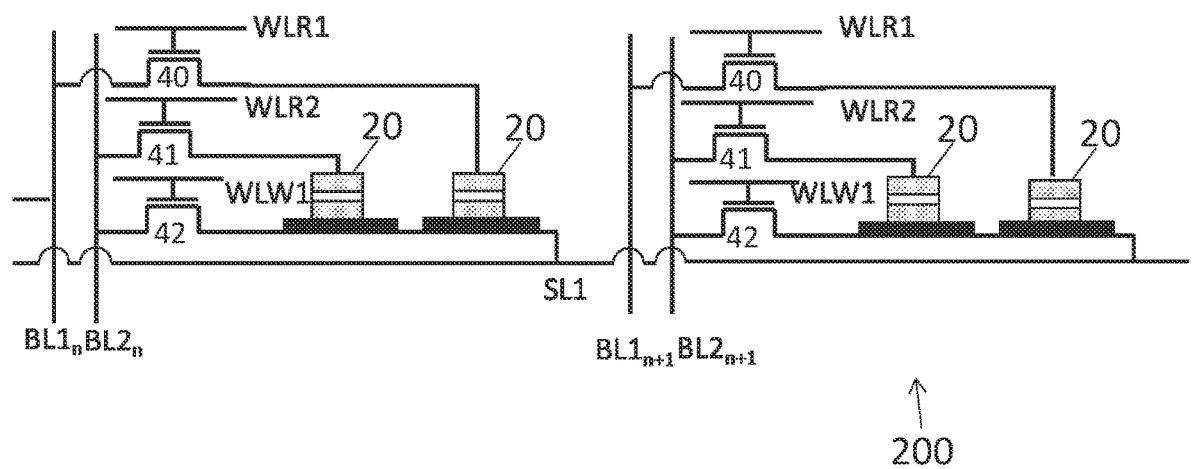
FIG. 4c represents an array comprising two of the SOT-MRAM cell of FIG. 4a arranged in a row.

The array comprising a plurality of SOT-MRAM cells 100 can be arranged such that each of the first and second bit line BL1, BL2 that connects a column of SOT-MRAM cells 100 are orthogonal to at least the first source line SL1 that connects a row of SOT-MRAM cells 100. FIG. 4c shows an array 200 comprising two of the SOT-MRAM cell 100 of FIG. 4a. In particular, each of the first and second bit line $BL1_n$, $BL2_n$, $BL1_{n+1}$, $BL2_{n+1}$ is orthogonal to the first source line SL1 that is connected to a SOT-MRAM element 10 in a row.

During a write operation, a write voltage $V_{write}$, positive or negative, is applied on the second bit line BL2 and the first source line SL1 is set to "0". The first write word line $WLW_n$ (or $WLW_{n+1}$) controls the third transistor 42 in the passing mode, so that a SOT current 31 is passed in the SOT line 30 and write the MTJ 20. The first and second transistors 40, 41 are in the closed mode.

Alternatively, instead of applying a negative voltage on BL2, a positive write voltage $V_{write}$ can be applied to the SL1 and BL2 is set at "0".

During a read operation, a read voltage $V_{read}$ can be applied on the first bit lire BL1 while the first source line SL1 is set to "0". The first read word line $WLR1_{n+1}$ (or $WLR1_n$) controls the first transistor 40 in the passing mode, such as to pass a read current 32 in the MTJ 20. The second and third transistors 41, 42 are in the closed mode. Alternatively, a read voltage $V_{read}$ can be applied on the second bit line BL2 while the first source line SL1 is set to "0". The second read word line $WLR2_n$ (or $WLR2_{n+1}$) controls the second transistor 41 in the passing mode, such as to pass a read current 32 in the MTJ 20. The first and third transistors 40, 42 are in the closed mode. Simultaneous reading on two ports can also be achieved by simultaneously applying the read voltage $V_{read}$ on the first and second bit lines BL1, BL2 and setting the first source line SL1 to "0". The first and second read word lines $WLR1_n$ (or $WLR1_{n+1}$), $WLR2_n$ (or $WLR2_{n+1}$) control the first and second transistors 40, 41 in the open mode, respectively. The read current 32 is then passed in the two MTJs 20.

The SOT-MRAM cell 100 and array 200 can thus be written on one port and allows for simultaneous reading on two ports.

Figure 5A:
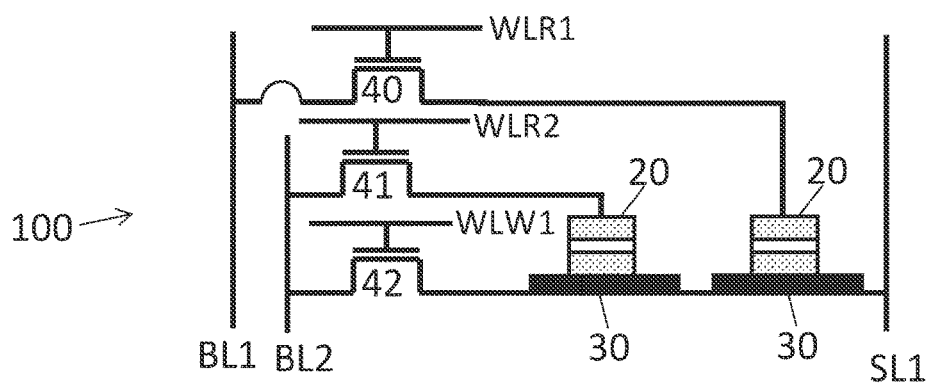
FIG. 5a shows a SOT-MRAM cell, according to another embodiment.

FIG. 5a shows a SOT-MRAM cell 100, according to another embodiment. The SOT-MRAM cell 100 comprises two SOT-MRAM elements 10, connected by their SOT line 30, and a first source line SL1 connected to one end of the SOT line 30. A first bit line BL1 connects the second end of the MTJ 20 via a first transistor 40. A second bit line BL2 connects the second end of the other MTJ 20 via a second transistor 41 and connects the other end of the SOT line 30 via a third transistor 42. A first read word line WLR1 and a second read word line WLR2 connect the gate of the first transistor 40 and the second transistor 41, respectively. A first write word line WLW1 connects the gate of the third transistor 42. The SOT-MRAM cell 100 of FIG. 5a forms a 3T2R circuit.

Figure 5B:
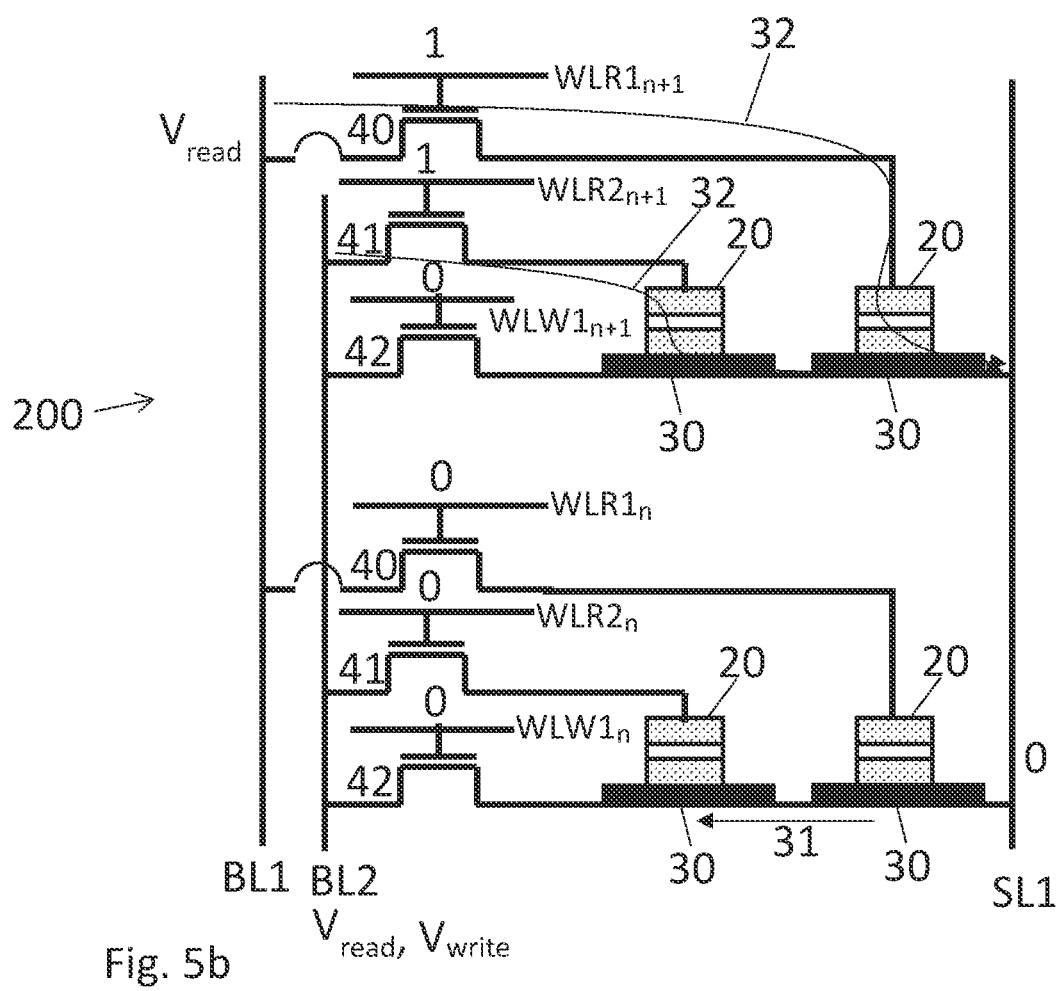
FIG. 5b illustrates an array comprising two of the SOT-MRAM cell of FIG. 5a arranged columnwise, according to an embodiment.

FIG. 5b illustrates an array 200 comprising two of the SOT-MRAM cell 100 of FIG. 5a arranged columnwise, according to an embodiment. Each of the first and second bit line BL1, BL2 and the first source line SL1 is connected to the pair of SOT-MRAM element 10 in a column. It is understood that the array 200 can comprise more that two SOT-MRAM cells 100. As mentioned above, the source line SL1 can be connected to a row of SOT-MRAM cells 100 whereas the bit lines BL1, BL2 are connected to a column of SOT-MRAM cells 100. For example, each of the first and second bit line BL1, BL2 can be orthogonal to the first source line SL1 that is connected to a row of SOT-MRAM element 10.

During a write operation, a write voltage $V_{write}$, positive or negative, is applied on the first bit line BL2 and the first source line SL1 is set to "0". The first write word line WLW1 controls the third transistor 42 in the passing mode, so that a SOT current 31 is passed in the SOT line 30 and write the two MTJs 20. The first and second transistors 40, 41 are in the closed mode.

Alternatively, instead of applying a negative voltage on BL2, a positive write voltage $V_{write}$ can be applied to the SL and BL2 is set at "0".

During a read operation, a read voltage $V_{read}$ can be applied on the first bit line BL1 while the first source line SL1 is set to "0". The first read word line WLR1 controls the first transistor 40 in the passing mode, such as to pass a read current 32 in the MTJ 20 connected to the first transistor 40. The second and third transistors 41, 42 are in the closed mode. Alternatively, a read voltage $V_{read}$ can be applied on the second bit line BL2 while the first source line SL1 is set to "0". The second read word line WLR2 controls the second transistor 41 in the passing mode, such as to pass a read current 32 in the MTJ 20 connected to the second transistor 41. The first and third transistors 40, 42 are in the closed mode. Preferably, simultaneous reading on two ports is performed by applying a read voltage $V_{read}$ on the first and second bit lines BL1, BL2, setting the first source line SL1 to "0" and having the first and second read word lines WLR1, WLR2 controlling respectively the first and second transistors 40, 41 in the passing mode, such as to pass a read current 32 in the two MTJs 20. The third transistor 42 is in the closed mode.

The SOT-MRAM cell 100 of FIG. 5a and the array 200 of FIG. 5b are capable of simultaneous reading on two ports and writing on one port. Moreover, a differential read operation can be performed on one port using BL1 and BL2. The differential read operation comprises writing two opposite values in the two MTJs 20 and applying a voltage $V_{read}$ on BL1 and BL2 such as to create a difference in the read current 32 between the two MTJs 20.

Figure 6:
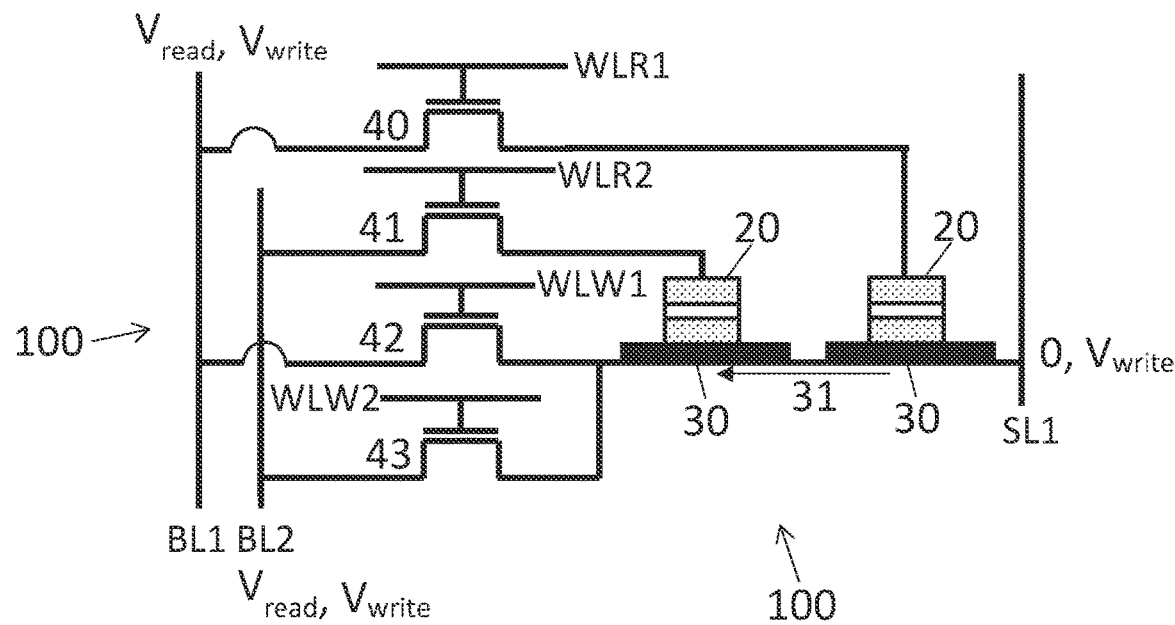

FIG. 6 shows a variant of the SOT-MRAM cell 100 of FIG. 5a. Here, the SOT-MRAM cell 100 further comprises a fourth transistor 43 connecting the second bit line BL2 to the other end of the SOT line 30. The SOT-MRAM cell 100 of FIG. 6 forms a 4T2R circuit. A second write word line WLW2 connects the gate of the fourth transistor 43.

The SOT-MRAM cell 100 of FIG. 6 allows for dual port writing. During a write operation, a write voltage $V_{write}$, positive or negative, can be applied on one of the first or second bit lines BL1, BL2 while setting the first source line SL1 to "0" and controlling respectively the third or fourth transistor 42, 43 in the passing mode, such as to pass a SOT current 31 in the SOT line 30.

The SOT-MRAM cell 100 of FIG. 6 further allows for simultaneous read on two ports, by applying a read voltage $V_{read}$ on the first and second bit lines BL1, BL2, setting the first source line SL1 to "0" and controlling the first and second transistor 40, 41 in the passing mode, such as to pass the read current 32 in the two MTJs 20.

The SOT-MRAM cell 100 of FIG. 6 thus provides a read and write access on the same column but not on the same SOT-MRAM cell 100. The SOT-MRAM cell 100 is also adapted for performing a differential read operation on a single port architecture.

During the write operation, a negative voltage $-V_{write}$ may need to be applied on the first or second bit lines BL1, BL2.

Figure 7:
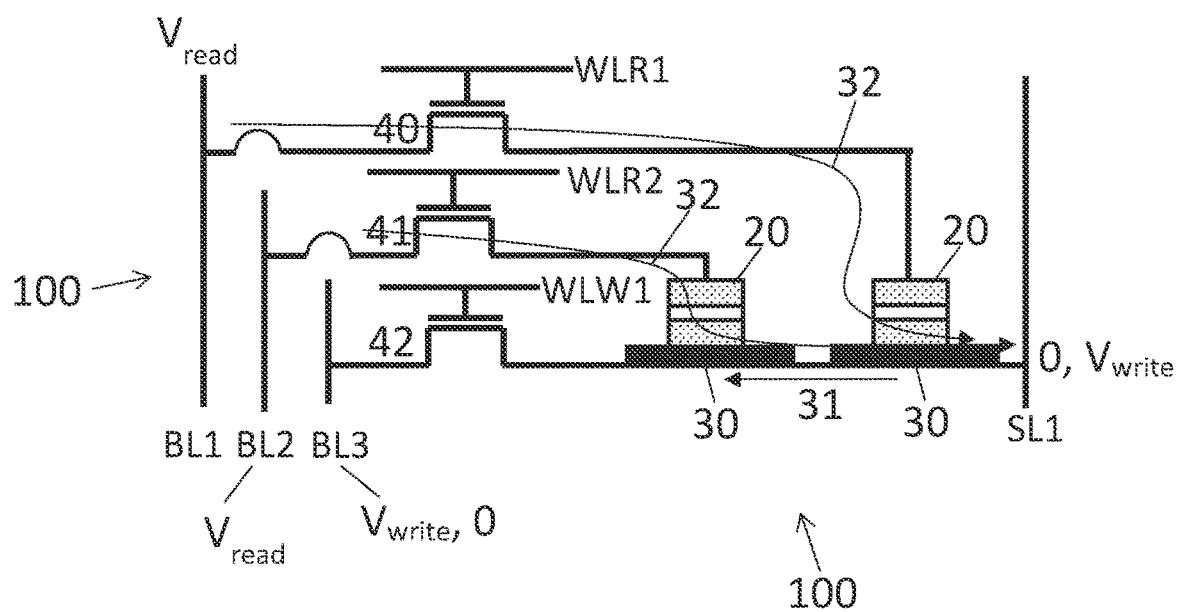

FIG. 7 shows another variant of the SOT-MRAM cell 100 of FIG. 5a, wherein the third transistor 42 is not connected to the second bit line BL2 but to a third bit line BL3. The SOT-MRAM cell 100 of FIG. 7 forms a 3T2R circuit.

During a write operation, a write voltage $V_{write}$, positive or negative, is applied on the third bit line BL3 while setting the first source line SL1 to "0" and controlling the third transistor 42 in the passing mode. The SOT current 31 is then passed in the SOT line 30, writing the two MTJs 20.

Alternatively, instead of applying a negative voltage on BL2, a positive write voltage $V_{write}$ can be applied to the SL1 and BL3 is set at "0".

The SOT-MRAM cell 100 of FIG. 7 can be read simultaneously on two ports by applying a read voltage $V_{read}$ on the first and second bit lines BL1, BL2, setting the first source line SL1 to "0" and controlling the first and second transistor 40, 41 in the passing mode, such as to pass the read current 32 in the two MTJs 20.

The SOT-MRAM cell 100 of FIG. 7 allows for read and write access on the same column and is adapted for performing a differential read operation (single port). However, the SOT-MRAM cell 100 of FIG. 7 needs a negative voltage on the third bit line BL3 during the write operation in case of two ports.

In a variant of the SOT-MRAM cell 100 of FIG. 7 (not shown), the first, second and third transistors 40, 41, 42 are controlled by the same word line. Such configuration has a smaller area. The SOT-MRAM cell 100 of FIG. 7 can be used as a single port or two port cell.

Figure 8:
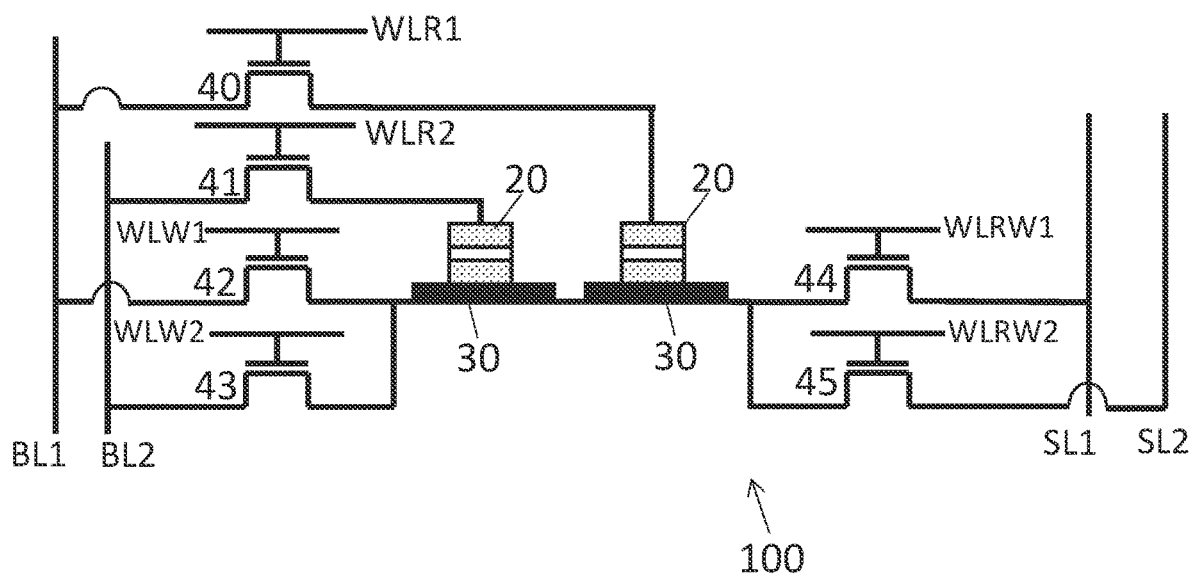
FIG. 8 shows a variant of the SOT-MRAM cell of FIG. 6.

FIG. 8 shows a variant of the SOT-MRAM cell 100 of FIG. 6, further comprising a fifth transistor 44 connected between the first source line SL1 and the SOT line 30. The SOT-MRAM cell 100 further comprises a second source line SL2 connected to one end of the SOT line 30 via a sixth transistor 45. The fifth and sixth transistors 44, 45 are respectively controlled by the first and second word lines WLW1, WLW2. The SOT-MRAM cell 100 of FIG. 8 forms a 6T2R circuit.

The SOT-MRAM cell 100 of FIG. 8 allows for dual port writing and reading on both bit lines BL1, BL2 and source lines SL1, SL2. During a write operation, a write voltage $V_{write}$ is applied on the first and/or second bit lines BL1, BL2 while the first and/or second source lines SL1, SL2 are set to "0". Alternatively, the write operation can be performed by applying a write voltage $V_{write}$ on the first and/or second source lines SL1, SL2 and by setting to "0" the first and/or second bit lines BL1, BL2. The first or second word lines WLW1, WLW2 are controlled to respectively set the third and fourth transistor 42, 43 in the passing mode. The first or second read/write word lines WLRW1, WLRW2 are controlled to respectively set the sixth and seventh transistor 44, 45 in the passing mode. The first and second transistors 40, 41 are in the closed mode.

The SOT-MRAM cell 100 of FIG. 8 allows for simultaneous read on two ports by applying a read voltage $V_{read}$ on the first and second bit lines BL1, BL2 and setting the first and second source line SL1, SL2 to "0". Simultaneous read on two ports can also be achieved by applying a read voltage $V_{read}$ on the first and second source line SL1, SL2 and setting the first and second bit lines BL1, BL2 to "0". During the read operation, the first and second transistor 40, 41 are set in the passing mode as well as transistor 44 or 45, such as to pass the read current 32 in the MTJs 20. The third or fourth transistor 42, 43 are in the closed mode.

The SOT-MRAM cell 100 of FIG. 8 allows for using a positive voltage $V_{write}$ and $V_{read}$ on the ports BL1, BL2, SL1, SL2. Simultaneous read access is possible on the two ports whatever the cell, simultaneous write access is possible on the same column in an array but not on the same SOT-MRAM element 10. The SOT-MRAM cell 100 is adapted for performing a differential read operation in case of use in a single port architecture.

Figure 9A:
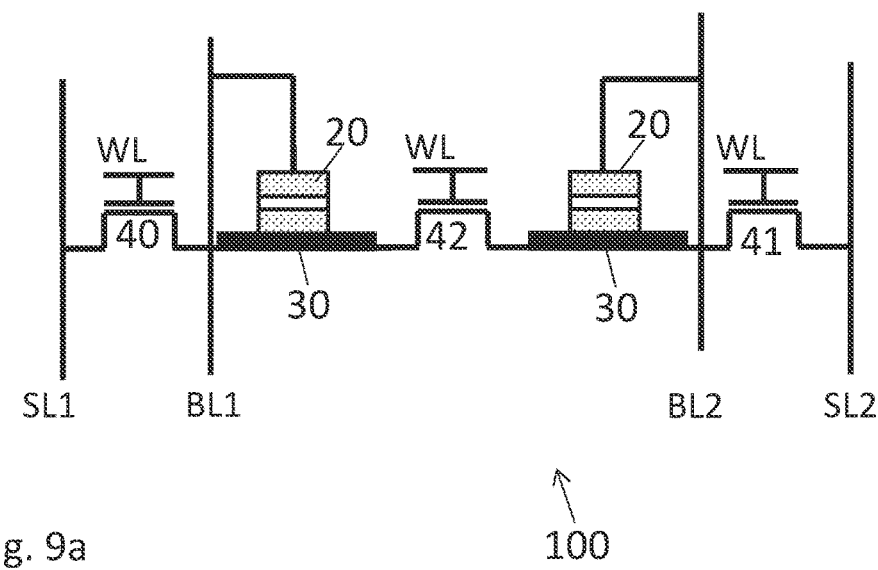
FIGS. 9a-c illustrate a SOT-MRAM cell (FIG. 9a), during a write operation (FIG. 9b) and a read operation (FIG. 9c), according to another embodiment.
Figure 9B:
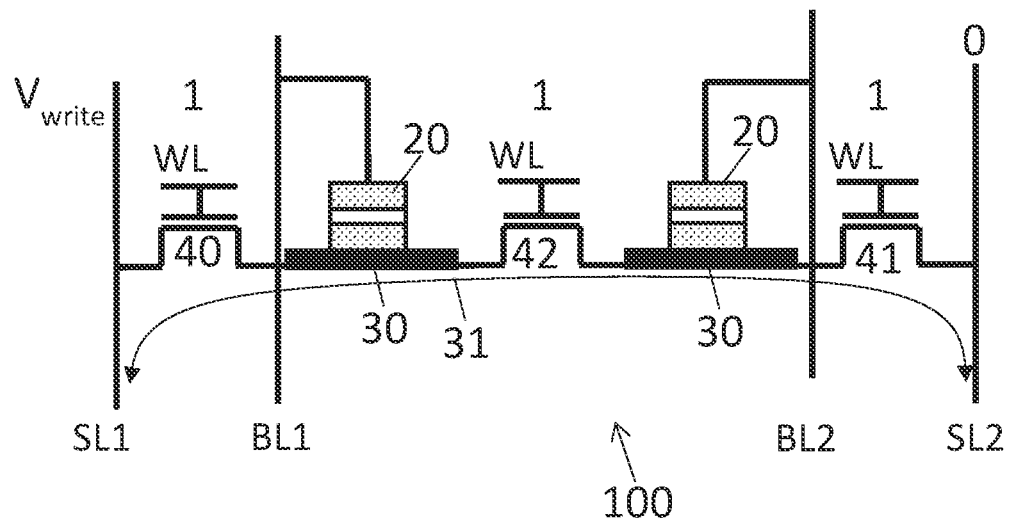
Figure 9C:
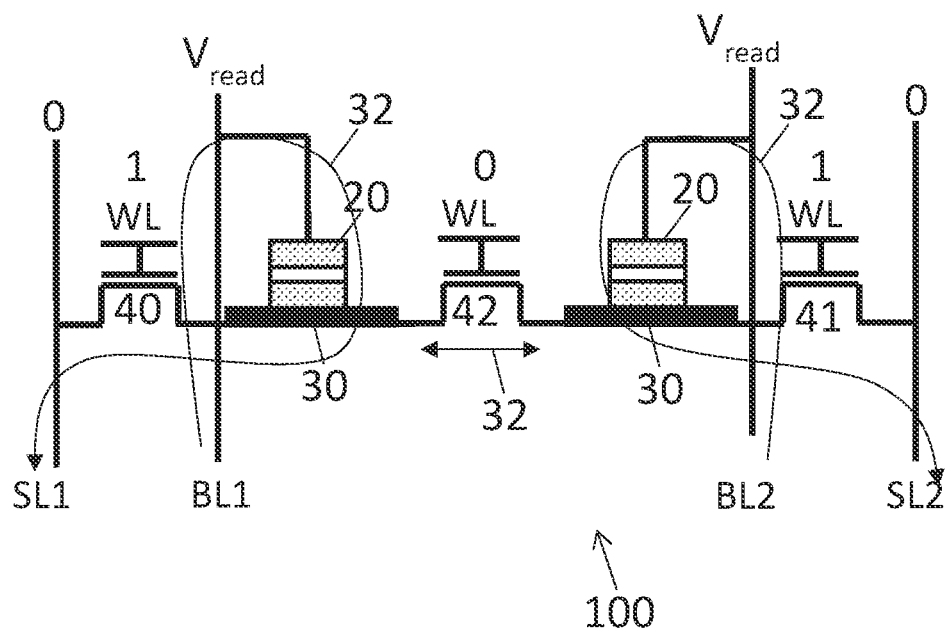

FIGS. 9a-c illustrate a SOT-MRAM cell 100, according to another embodiment. The SOT-MRAM cell 100 includes first and second bit lines BL1, BL2, each directly connected to the second end of one of the MTJs 20. First and second source lines SL1, SL2 are individually connected to the SOT line 30 via a first and second transistor 40, 41, respectively. A third transistor 42 is included on the SOT line 30 between the two SOT-MRAM cells 10. A word line WL can be controlled to set the transistors 40, 41 and 42 in the closed or passing mode. The SOT-MRAM cell 100 of FIG. 9a forms a 3T2R circuit.

FIG. 9b illustrates the SOT-MRAM cell 100 of FIG. 9a during a write operation, wherein a write voltage $V_{write}$ is applied to one of the first or second source line SL1, SL2 while the other source line is set to "0". A SOT current 31 passes in the SOT line 30 when the three transistors 40-42 are set in the passing mode "1" by the word line WL.

FIG. 9c illustrates the SOT-MRAM cell 100 of FIG. 9a during a read operation, wherein a read voltage $V_{read}$ is applied to the first bit line BL1 and to the second bit line BL2, while the source lines SL1, SL2 are set to "0". The word line WL sets the three transistors 40-42 in the passing mode "1". In this way, a read current 32 flows between the first bit line BL1 and the first source line SL1, passing through one of the MTJs 20, and a read current 32 flows between the second bit line BL2 and the second source line SL2, passing through the other MTJ 20. The read current can also flow in the SOT line 30, between the two SOT-MRAM cells 10 since the third transistor 42 is in the open mode.

The read current 32 passing in the SOT line 30 can cause unwanted reorientation of the free magnetization. Due to the symmetrical configuration of the SOT-MRAM cells 10 of FIGS. 9a-c, the read current 32 can flow between the two SOT-MRAM elements 100, through the third transistor 42. The read current 32 will thus split in two current portions of opposite directions in the SOT line 30 below each MTJ 20. Any parasitic writing of the MTJs 20 by the read current 32 is then cancelled.

Figure 9D:
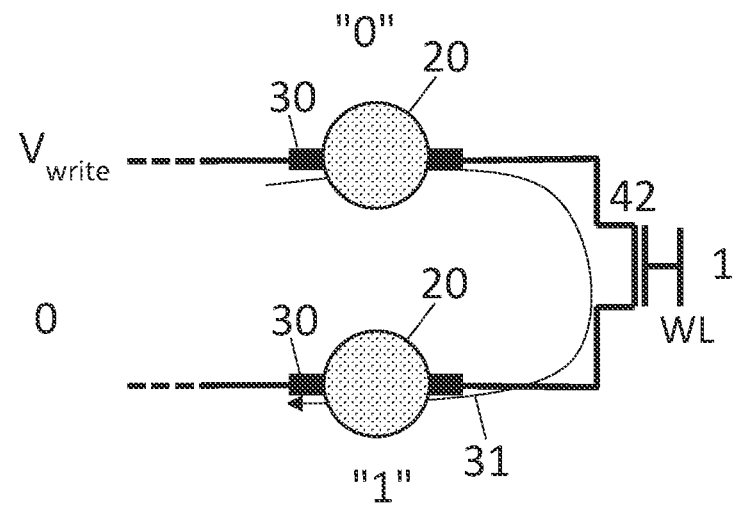
FIG. 9d shows a top view of the SOT-MRAM cell 100 of FIGS. 9a-c.

FIG. 9d shows a top view of the SOT-MRAM cell 100, wherein the SOT-MRAM elements 10 are arranged in a U-shape configuration. During the write operation, the U-shape configuration of the SOT line 30 allows the SOT current 31 to flow below one of the MTJs 20 in a direction opposite to the one of the SOT current 31 flowing below the other MTJ 20. The SOT current 31 can thus write two opposite logical states in the MTJs 20, such as sates "0" (parallel) in one MTJ 20 and "1" in the other MTJ 20 (antiparallel). A differential read operation can thus be performed. This U-shape configuration can be applied to any one of the SOT-MRAM cell 100 of FIGS. 9a-c and FIGS. 10a-c but also to the SOT-MRAM cell 100 configurations of FIGS. 4 to 8 in the absence of the third transistor 42 on the SOT line 30 between the two SOT-MRAM cells 10.

Figure 10A:
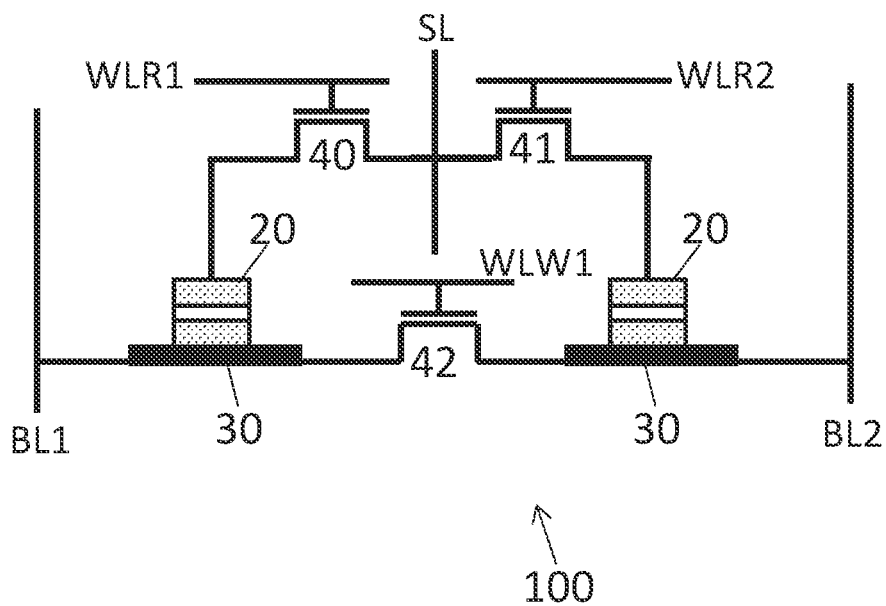
FIGS. 10a-c illustrates a SOT-MRAM cell in another configuration (FIG. 10a), during a write operation (FIG. 10b) and a read operation (FIG. 10c).
Figure 10B:
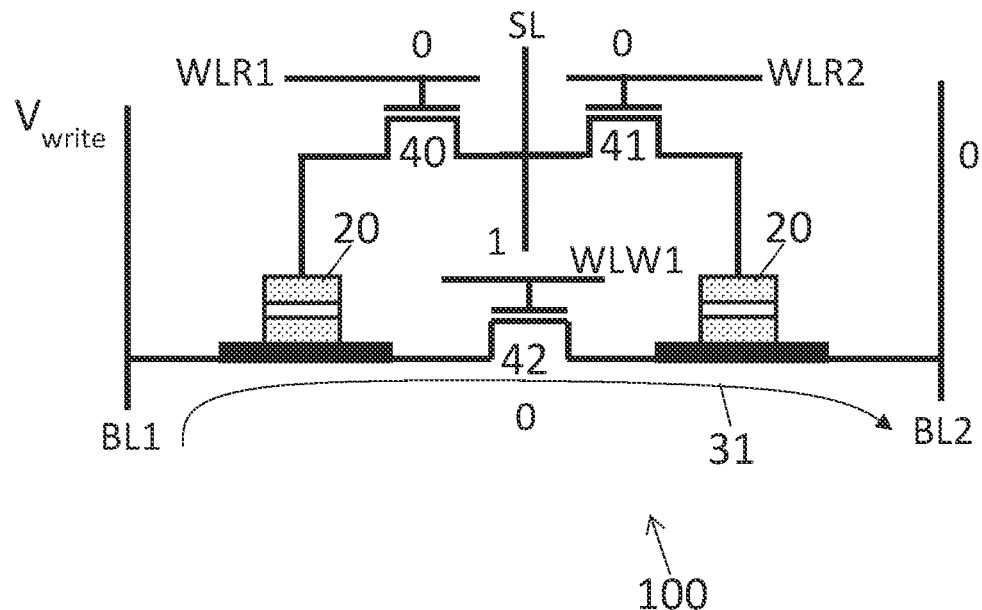
Figure 10C:
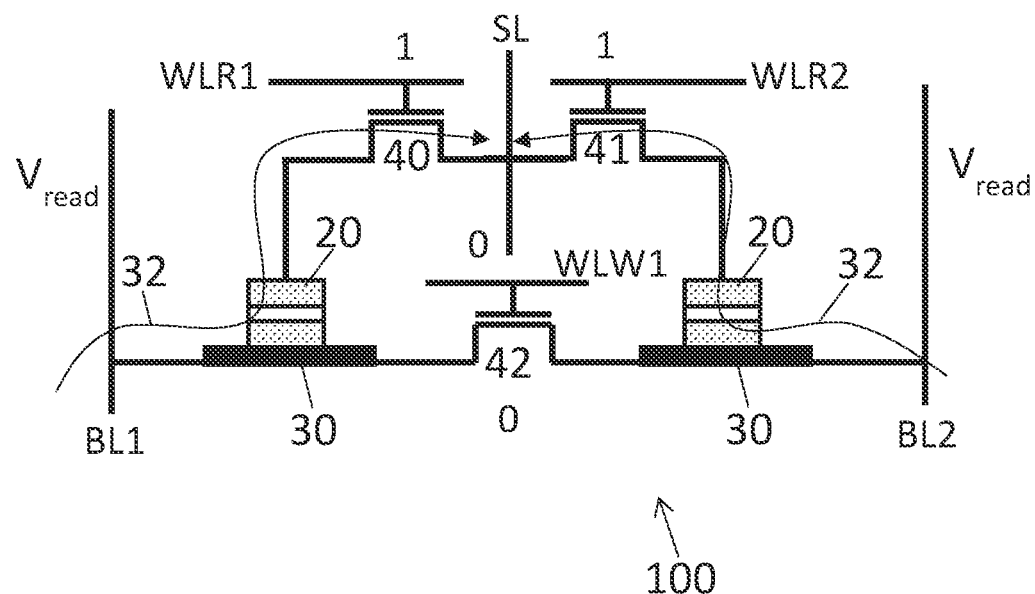

FIGS. 10a-c illustrates a SOT-MRAM cell 100, in another configuration. The SOT-MRAM cell 100 includes a first bit line BL1 directly connected to one end of the SOT line 30 and a second bit line BL2, also directly connected to the other end of the SOT line 30. A source line SL connects the second end of each of the two MTJs 20 via a first transistor 40 and a second transistor 41, respectively. A third transistor 42 is included on the SOT line 30 between the two SOT-MRAM cells 10. A first read word line WLR1 and a second read word line WLR2 set, respectively, the first and second transistors 40, 41 in the closed or open mode. The third transistor 42 is controlled by a first write word line WLW1. The SOT-MRAM cell 100 of FIGS. 10a-c forms a 3T2R circuit.

FIG. 10b illustrates the SOT-MRAM cell 100 during a write operation, whereby a write voltage $V_{write}$ is applied to the one of the first or second bit line BL1, BL2 while the other bit line is set to "0". The third transistor 42 is set in the passing mode such that a SOT current 31 passes in the SOT line 30. Transistors 40 and 41 are set in the closed mode.

FIG. 10c illustrates the SOT-MRAM cell 100 during a read operation, whereby a read voltage $V_{read}$ is applied to the first bit line BL1 and to the second bit line BL2, while the source line SL is set to "0". The first and second transistors 40, 41 are set to the passing mode, such that a read current 32 flows between the first bit line BL1 and the source line SL and between the second bit line BL2 and the source line SL, passing through each of the MTJs 20. The third transistor 42 is set to the closed mode and no current flows between the two MTJs 20. The SOT-MRAM cell 100 is adapted for performing a differential read operation (single port).

REFERENCE NUMBERS AND SYMBOLS

10 SOT-MRAM element
100 SOT-MRAM cell
20 MTJ
200 array
21 pinned ferromagnetic layer
210 pinned magnetization
22 tunnel barrier layer
23 free ferromagnetic layer
230 free magnetization
24 first antiferromagnetic layer
30 SOT layer
31 SOT current
40 first transistor
41 second transistor
42 third transistor
43 fourth transistor
44 fifth transistor
45 sixth transistor
BL bit line
BL1 first bit line
BL2 second bit line
BL3 third bit line
$i_{leak}$ leakage current
SL source line
SL1 first source line
SL2 second source line
$V_{read}$ read voltage $V_{write}$ write voltage
WL word line
WLR read word line
WLW write word line
WLW1 first write word line
WLW2 second write word line
WLR1 first read word line
WLR2 second read word line
WLRW1 first read/write word line
WLRW2 second read/write word line

The invention claimed is:

1. A spin-orbit torque (SOT)-magnetic random access memory (MRAM) cell, comprising:
    at least one magnetic tunnel junction (MTJ) comprising a tunnel barrier layer between a pinned ferromagnetic layer and a free ferromagnetic layer;
    a SOT line, extending substantially parallel to the plane of the layers and contacting a first end of said at least one MTJ;
    at least a first source line connected to one end of the SOT line;
    at least a first bit line and a second bit line,
    wherein the SOT-MRAM cell comprises at least one MTJ, each bit line being connected to the other end of said at least one MTJ, wherein the first bit line connects said at least one MTJ via a first transistor and the second bit line connects said at least one MTJ via a second transistor, and wherein the second bit line further connects the other end of the SOT line of said at least one MTJ via a third transistor; or
    wherein the SOT-MRAM cell comprises two MTJs, each MTJ being directly connected to one of the first bit line and second bit line.

2. SOT-MRAM cell, according to claim 1,
    wherein the SOT-MRAM cell comprises two MTJs, each MTJ being connected to one of the first bit line and second bit line; and
    wherein the first bit line is further connected to the other end of the SOT line via a fourth transistor.

3. SOT-MRAM cell, according to claim 1,
    wherein the SOT-MRAM cell comprises two MTJs, each MTJ being connected to one of the first bit line and second bit line; and
    comprises a third bit line connected to the other end of the SOT line via a third transistor.

4. SOT-MRAM cell, according to claim 2,
    wherein the SOT-MRAM cell comprises two MTJs, each MTJ being connected to one of the first bit line and a second bit line, and a second source line; and
    wherein the first source line is connected to said one end of the SOT line via a fifth transistor and the second source line is connected to said one end of the SOT line via a sixth transistor.

5. SOT-MRAM cell, according to claim 1,
    comprising two MTJs, a first bit line and a second bit line, each being directly connected to the second end of one of the MTJs, a first and a second source line, each being connected to the SOT line via a first and second transistor, respectively, and a third transistor included on the path of the SOT line between the two MTJs.

6. Array comprising a plurality of SOT-MRAM cell according to claim 1,
    wherein each of the first and second bit line and said at least the first source line is connected to a SOT-MRAM element in a column or a row.

7. SOT-MRAM cell, according to claim 1,
    wherein the SOT-MRAM cell comprises two MTJs, the first bit line connecting one of the two MTJs and the second bit line connecting the other MTJ.

8. SOT-MRAM cell, according to claim 1,
    wherein the SOT-MRAM cell comprises two MTJs, the first bit line and the second bit line connecting each of the two MTJs.

* * * * *